(12) United States Patent
Chen

(10) Patent No.: US 7,622,956 B2
(45) Date of Patent: Nov. 24, 2009

(54) OUTPUT DRIVING CIRCUIT

(75) Inventor: Yi-Lin Chen, Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/944,403

(22) Filed: Nov. 21, 2007

(65) Prior Publication Data
US 2008/0122488 A1     May 29, 2008

(30) Foreign Application Priority Data
Nov. 23, 2006   (TW) .............................. 95143358 A

(51) Int. Cl.
   *H03K 17/16*   (2006.01)
(52) U.S. Cl. .......................................... 326/82; 326/30
(58) Field of Classification Search .................. 326/30, 326/82–87
   See application file for complete search history.

(56) References Cited

U.S. PATENT DOCUMENTS

| 5,977,807 | A | 11/1999 | Watanabe |
| 6,495,997 | B2 | 12/2002 | Hall |
| 6,559,690 | B2 | 5/2003 | Waldrop |
| 6,580,290 | B1 | 6/2003 | Robinson |
| 6,714,043 | B1 | 3/2004 | Sharpe-Geisler |
| 6,741,130 | B2 | 5/2004 | Wey |
| 6,774,665 | B2 | 8/2004 | Amick |
| 6,885,226 | B2 | 4/2005 | Waldrop |
| 7,161,378 | B2 * | 1/2007 | Kang et al. .................. 326/30 |
| 7,400,173 | B1 * | 7/2008 | Kwong et al. ................. 326/86 |
| 2003/0193350 | A1 * | 10/2003 | Chow ........................ 326/83 |

FOREIGN PATENT DOCUMENTS

TW               425764            3/2001

* cited by examiner

*Primary Examiner*—James H. Cho
*Assistant Examiner*—Thienvu V Tran
(74) *Attorney, Agent, or Firm*—Winston Hsu

(57) ABSTRACT

Disclosed is an output driver, which comprises: a resistance element with resistance, coupled to an output terminal; a current mode driving circuit, coupled to the resistance element, for providing a first current to the output terminal, wherein at least one of the amount of the first current and the resistance of the resistance element is adjusted according to a control signal; and a control circuit for generating the control signal according to a mode signal, wherein the mode signal corresponds to at least two technology standards.

20 Claims, 4 Drawing Sheets

OUTPUT DRIVING CIRCUIT

BACKGROUND OF THE INVENTION

1. Field of the Invention

The present invention relates to an output driver, and particularly relates to an output driver of a memory.

2. Description of the Prior Art

Since the performance of modern processors is continuously improving, the memory bandwidth becomes a critical characteristic affecting the performance of a computer system. The technique of Double-Data-Rate (DDR) memory has developed from DDRI to DDRII and through to the newest: DDRIII. Each standard, however, has specific requirements. According to the DDR standard determined by JDEC, DDRI memory must follow the SSTL-25 standard, where the voltage on the I/O port of the memory must be 2.5 V. DDRII memory must follow the SSTL-18 standard, where the voltage on the I/O port of the memory must be 1.8 V. DDRIII memory must follow the SSTL-15 standard, where the voltage on the I/O port of the memory must be 1.5 V.

Therefore, the width of a transistor and I/O pad area must be increased for meeting different standards, so the total area of a circuit and the cost thereof are increased. Also, different voltages or different circuits must be provided if memories of different standards need to be supported. Accordingly, the inconvenience of designing, and related costs, are increased.

SUMMARY OF THE INVENTION

One objective of the present invention is to provide an output driving circuit, which utilizes a current mode driving circuit to cooperate with a load for providing suitable output voltage to input/output pads.

Another objective of the present invention is to provide an output driving circuit, which can meet at least two different technical specifications.

A further objective of the present invention is to provide an output driving circuit, which can meet at least two different technical specifications to decrease the layout area of a printed circuit board.

Another objective of the present invention is to provide an output driving circuit, which can meet at least two different technical specifications, thereby different voltages or voltage reducing elements are not needed and the inconvenience and the cost are decreased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
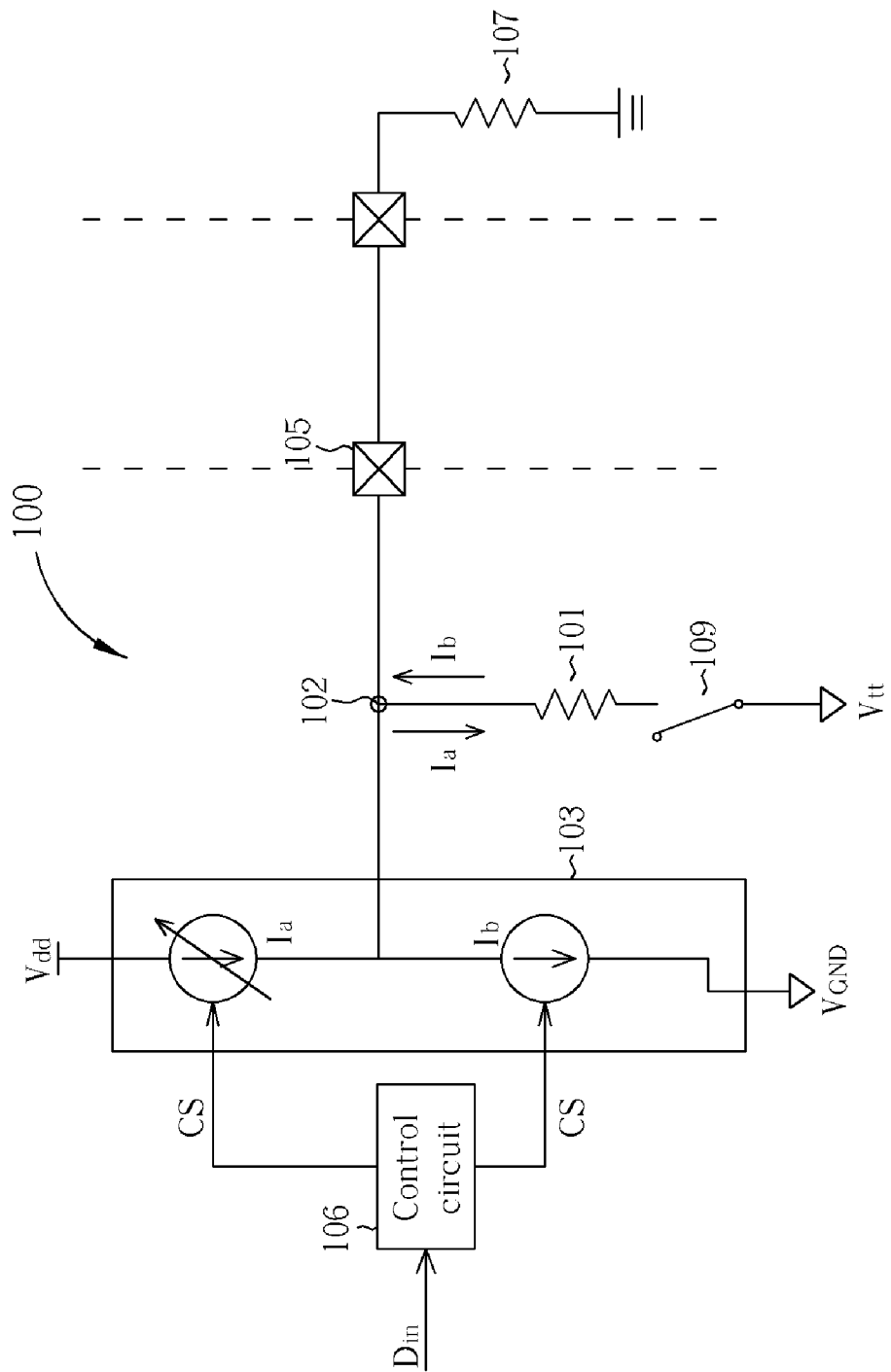
FIG. 1 is a circuit diagram illustrating the output driving circuit according to a first embodiment of the present invention.

FIG. 1 is a circuit diagram illustrating the output driver 100 according to the first embodiment of the present invention. As shown in FIG. 1, the output driver 100 comprises a resistor 101, an adjustable current mode driver 103, a control circuit 106 and a switch 109. The resistor 101 is coupled to an output terminal 102 and a first voltage level $V_{tt}$. The adjustable driver 103 is coupled to a second voltage level $V_{dd}$, the control circuit 106 and an output terminal 102 for selectively outputting a first predetermined current $I_a$ or draining a second predetermined current $I_b$ via the output terminal 102 to cooperate with at least one of the resistor 101, 107 to generate the output voltage level on the output terminal 102. In one preferred embodiment, the first voltage level $V_{tt}$ is half of the second voltage level $V_{dd}$. The resistor 107 in FIG. 1 represents the equivalent impedance of a memory device and the output driver 100 is located within a memory controller. For examples, the memory device can be a DDRI, DDRII, or DDRIII memory device, and the output driver 100 of the memory controller can output an output signal, which matches various standards (e.g. DDRI, DDRII, DDRIII standards).

In one embodiment, the resistance element 101 is an adjustable resistance element or an ODT (On Die Termination) corresponding to a memory of DDR specification. The ODT can be a signal termination device, which is used for enhancing the completeness of a signal and for cutting off the spreading of the signal to stop interference signals. Since the sockets of a memory on a main board are coupled via a bus, the DRAM that needs to operate will receive the signal and process it, while the DRAM that does not need to operate also receives the signal but releases the signal at once when the data stream signal is transmitted to the memory socket. The signal released by the DRAM not needing to operate will keep transmitting on the bus, thus the DRAM will repeatedly receive the signal and noise interference may occur. Accordingly, the existence of the ODT is necessary to prevent interference. DDRII further integrates the above-mentioned resistance to the memory. The DRAM controller adjusts the resistance value of the ODT to decrease the signal when the signal enters DDRII and does not need to be processed by the DRAM, that is, the DRAM is in a standby state. By this method, the signal will not be transmitted back to the bus by the original line and is absorbed by the memory, such that the issue of signal interference can be avoided. Such a method is called an ODT mechanism. As described above, ODT can maintain the completeness of the signal to increase the stability of a system. Furthermore, since the ODT is inside the memory and can decrease the path and operation time of the memory, and the ODT can decrease the feedback when the memory operates at a high speed for increasing the performance of the memory and the clock limitations. Also, in one embodiment the resistance element 107 is an outside loading (for example, the input resistance of a memory). The output driving circuit 100 can utilize the switch of the switching element 109 to make the resistance devices 101, 107 meet the specification of the coupled memory.

In one embodiment, the control circuit 106 receives a mode control signal $C_{MODE}$, which is used for informing the output driving circuit 100 of the type of coupled memory, and an input data $D_{IN}$. The control circuit 106 can therefore generate a control signal CS according to the mode control signal $C_{MODE}$ in order to control the value of at least one of the first current $I_a$ or the second current $I_b$ of the adjustable current mode driving circuit 103 to cooperate with the resistance element 101 or 107 for generating desired voltage corresponding to different specifications such as SSTL-25, SSTL-18, SSTL-15 on the output terminal 102.

Also, the adjustable current mode driving circuit 103 controls the slew rate of at least one of the first current $I_a$ or the second current $I_b$ to meet different specifications such as SSTL-25, SSTL-18, SSTL-15 according to the control signal CS. By this adjusting method, the signal outputted from the output terminal 102 can control the inside capacitance of a memory to obtain suitable slew rates and voltage levels for generating signals corresponding to DDRI, DDRII or DDRIII. In other words, the state of the output signal of the output driving circuit 100, i.e. high or low logic, corresponds to the input data $D_{IN}$. Also, the variation of the output signal of the output driving circuit 100 (for example, the high or low of the voltage level, the slew rate, or both of them) relates to the mode control signal $C_{MODE}$.

In one embodiment, the output signal of the output driving circuit 100 is a data signal or a strobe signal of a memory. In this case, the I/O pad 105 is a data pin or a strobe pin of the memory controller.

In one embodiment, the first switching element 205 and the second switching element 207 are transistors. The first predetermined current $I_a$ equals a better value of the second predetermined current $I_b$. A better value of the first voltage level $V_{tt}$ is half of the second voltage level $V_{dd}$, but this is not a limitation of the present invention.

Figure 2:
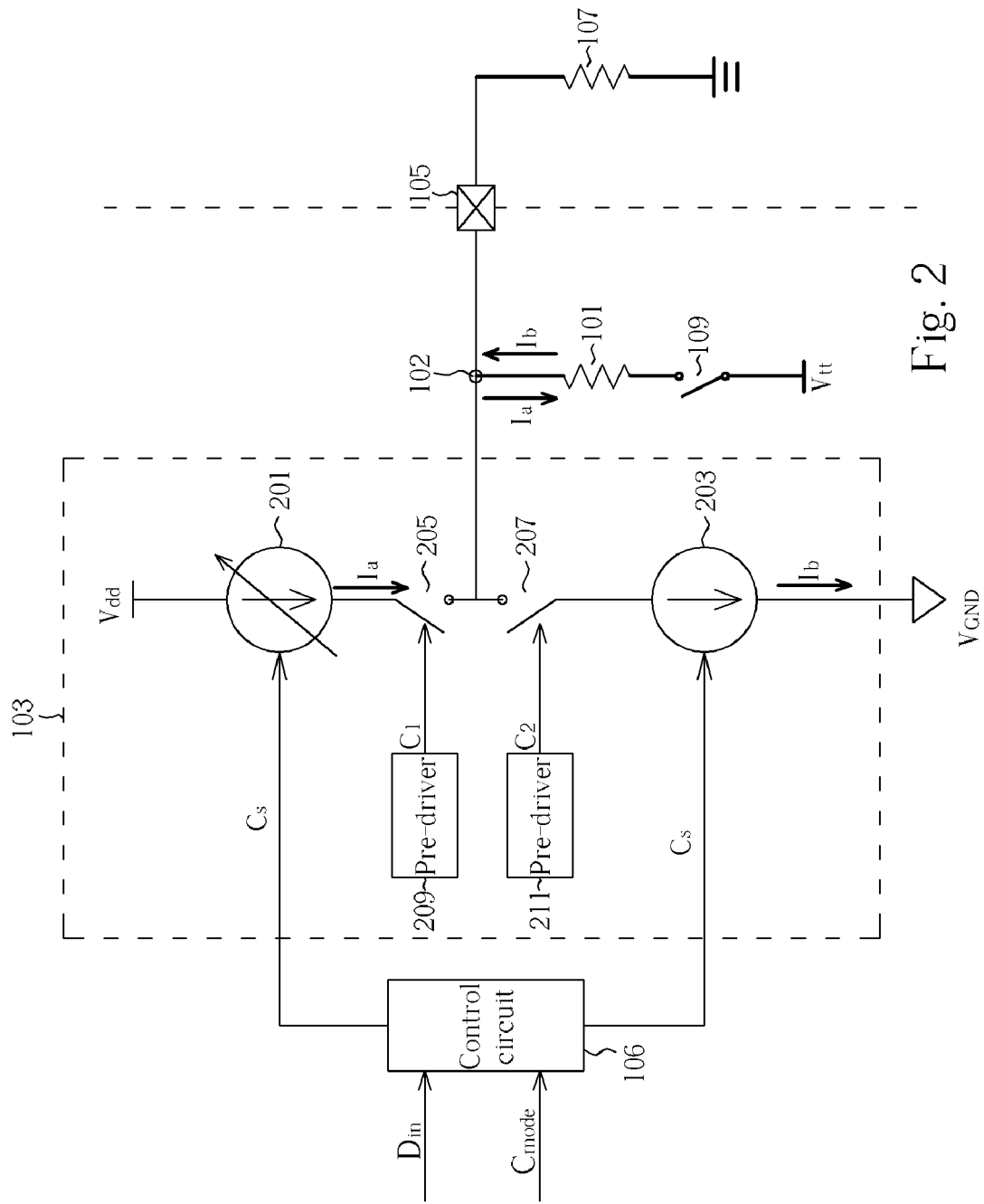
FIG. 2 is a circuit diagram illustrating the current mode driving circuit of the output driving circuit shown in FIG. 1.

FIG. 2 is a circuit diagram illustrating the current mode driving circuit 103 of the output driving circuit 100 shown in FIG. 1. It should be noted that the preferred embodiment is only for illustration purposes and is not mean to limit the scope of the present invention. The current mode driving circuit 103 comprises a first current source 201, a second current source 203, a first switching element 205, a second switching element 207, and pre-drivers 209 and 211. In this embodiment, the first current source 201 is adjustable, for providing a first current $I_a$, and the second current source 203 is used for providing a second current $I_b$. The pre-drivers 209 and 211 are used for controlling the first switching element 205 and the second switching element 207. In this embodiment, the first switching element 205 and the second switching element 207 do not operate at the same time for avoiding floating of the output terminal of the output driving circuit 100. The first current source 201 and the second current source 203 can be implemented by various kinds of circuits such as a current mirror. Examples are described as follows.

Figure 3:
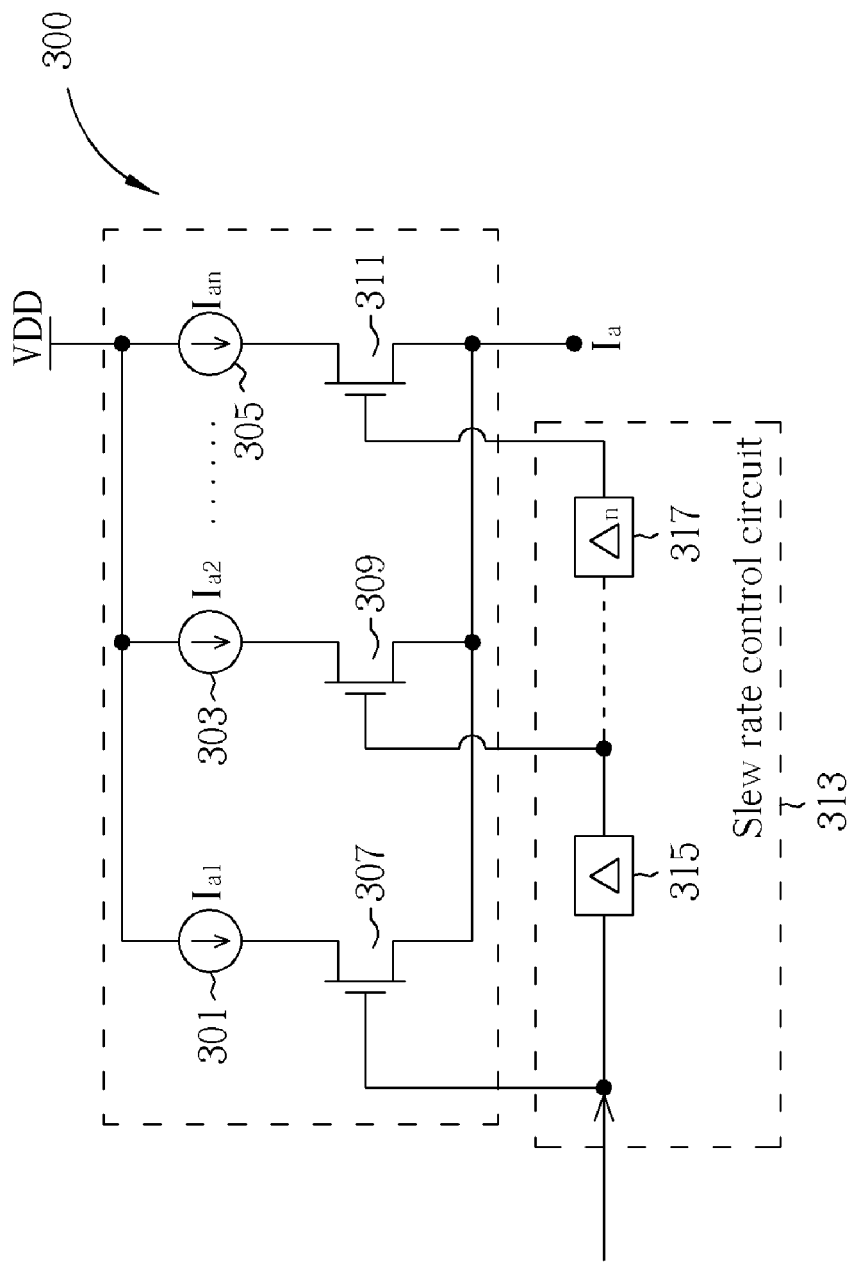
FIG. 3 is a circuit diagram illustrating the adjustable current source according to one embodiment of the present invention.

FIG. 3 is a circuit diagram illustrating the adjustable current source according to one embodiment of the present invention. As shown in FIG. 3, the adjustable current source 300 comprises a plurality of current sources 301, 303 and 305, a plurality of switches 307, 309 and 311, and a slew rate control circuit 313. The switches 307, 309 and 311 are used for controlling the current sources 301, 303 and 305 respectively to generate the first current $I_a$. The slew rate control circuit 313 is used for controlling the slew rate (that is, the variation rate) of the first current $I_a$ to meet corresponding specifications. In one embodiment, the slew rate control circuit 313 can comprise a plurality of delay units 315, 317 (only part of them are illustrated), to ensure the switches 307, 309 and 311 do not turn on at the same time. In this way, the slew rate of the first current $I_a$ can meet corresponding specifications, but this is merely an example, not a limitation of the present invention.

Figure 4:
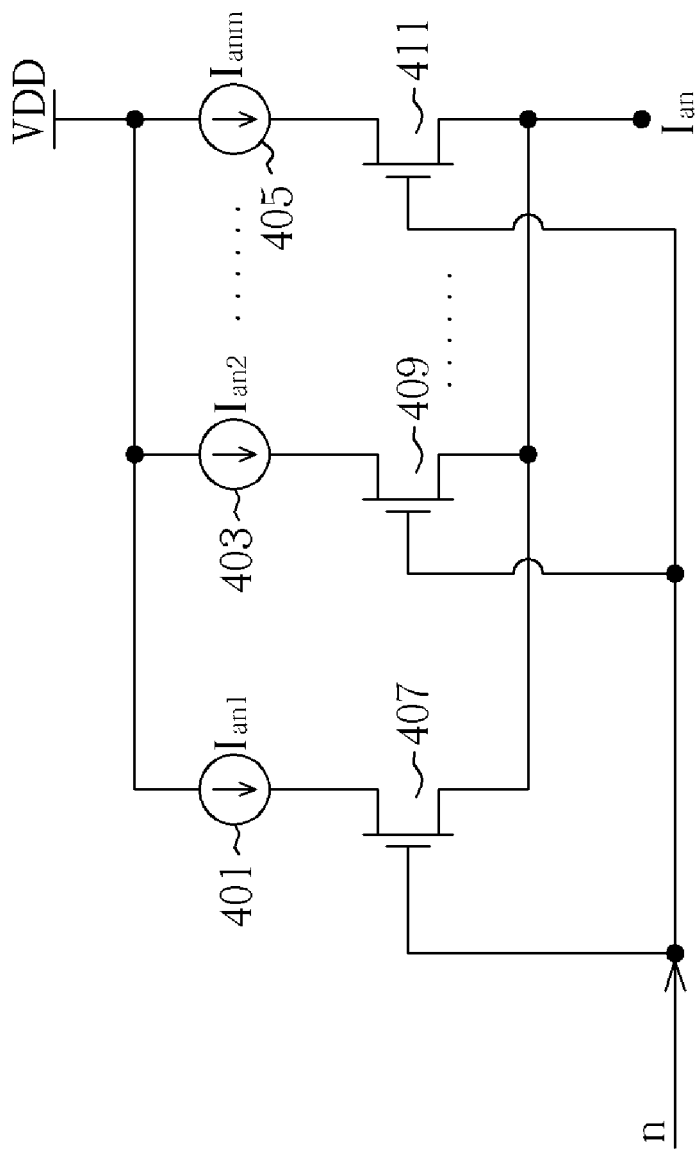
FIG. 4 is a circuit diagram illustrating the current source shown in FIG. 3.

The current sources 301, 303 and 305 can be adjustable current sources. FIG. 4 is a circuit diagram illustrating the current source shown in FIG. 3. The adjustable current source 305 comprises a plurality of current sources 401, 403 and 405, and a plurality of switches 407, 409 and 411. In this embodiment, the number of current sources 401, 403 and 405 is m and is controlled by an m-bit control signal. The circuits shown in FIG. 3 and FIG. 4 can be applied to the second current source 203, and the structures of current sources 401, 404 or 405 can utilize the circuit shown in FIG. 3.

Briefly speaking, the circuit shown in FIG. 3 can be utilized for adjusting the slew rate of the first current $I_a$ or the second current $I_b$, and the circuit shown in FIG. 4 can be utilized for adjusting the first current $I_a$ or the second current $I_b$. Therefore, the circuit according to the present invention can meet the voltage and the signal slew rate corresponding to different technical specifications. It should be noted that the circuits shown in FIG. 3 and FIG. 4 are only for examples and are not meant to limit the scope of the present invention. Persons skilled in the art can utilize other circuits to meet the same purposes.

According to the above-mentioned circuits, the voltages and signal slew rates corresponding to different technical specifications can be met without providing different voltages or voltage reducing elements, such that the inconvenience of design, the associated cost, and the layout of printed circuit boards can be decreased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output driver for generating an output signal according to an input data signal to an output terminal, the output driver comprising:
   a resistance element, coupled to the output terminal, having a resistance;
   a current mode driving circuit, coupled to the resistance element and the output terminal, for providing a first current to the resistance element, wherein a voltage level of the output signal corresponds to the current amount of the first current; and
   a control circuit, coupled to the current mode driving circuit, for generating a control signal according to a mode signal and the input data signal to adjust at least one of the resistance of the resistance element and the first current, wherein the mode signal corresponds to at least two technical specifications, and a voltage level, a slew rate or both of the output signal is associated with the mode signal.

2. The output driver of claim 1, wherein the current mode driving circuit adjusts the current amount of the first current according to the control signal, such that a slew rate of the output signal corresponds to one of the technical specifications.

3. The output driver of claim 1, wherein the technical specifications comprise an SSTL (Stub Series Terminated Logic)-25 technical specification and an SSTL-18 technical specification.

4. The output driver of claim 1, wherein the technical specifications comprise an SSTL-15 technical specification and an SSTL-18 technical specification.

5. The output driver of claim 1, wherein the technical specifications comprise an SSTL-25 technical specification, an SSTL-18 technical specification and an SSTL-15 technical specification.

6. The output driver of claim 1, wherein the resistance element comprises:
   a resistor; and a switch, coupled to the resistor and a voltage level, wherein the voltage level is substantially half of an operation voltage of the output driving circuit.

7. The output driver of claim 1, wherein the output terminal is a data pin or a strobe pin of a memory controller.

8. The output driver of claim 1, wherein the resistance element is an On-Die Termination (ODT).

9. The output driver of claim 1, wherein the current mode driving circuit comprises:
a first current source, for providing a first current; and
a first switching element, coupled to the first current source and the output terminal.

10. The output driver of claim 9, wherein the current mode driving circuit comprises:
a second current source, for providing the first current; and
a second switching element, coupled to the first current source and the output terminal.

11. The output driver of claim 10, wherein the current mode driving circuit comprises:
a pre-driver, for controlling the first switching element and the second switching element.

12. The output driver of claim 11, wherein the pre-driver controls the first switching element and the second switching element such that the first switching element and the second switching element do not operate at the same time.

13. A method for outputting a driving current, and the method comprising:
providing a resistance element, wherein the resistance element is coupled to an output terminal;
providing a first current to the output terminal to form an output signal corresponding to the first current;
providing a control signal according to a mode signal and an input data signal, wherein the mode signal corresponds to at least two technical specifications, and a voltage level, a slew rate or both of the output signal is associated with the mode signal; and
adjusting at least one of the resistance of the resistance element and the first current according to the control signal to adjust the output signal such that the waveform of the output signal matches one of the at least two technical specifications.

14. The method of claim 13, wherein the technical specifications comprise an SSTL (Stub Series Terminated Logic)-25 technical specification and an SSTL-18 technical specification.

15. The method of claim 13, wherein the technical specifications comprise an SSTL-15 technical specification and an SSTL-18 technical specification.

16. The method of claim 13, wherein the technical specifications comprise an SSTL-25 technical specification, an SSTL-18 technical specification and an SSTL-15 technical specification.

17. The method of claim 13, wherein the output terminal is a data pin or a strobe pin of a memory controller.

18. The method of claim 13, wherein the resistance element is an On-Die Termination (ODT).

19. The method of claim 13, wherein the method further comprising:
draining a second current from the resistance element to the output terminal to form the output signal corresponding to the second current, wherein the current amount of the second current changes in accordance with the control signal and the step of providing a first current and the step of draining a second current operate at different time.

20. The method of claim 13, wherein the method further comprising:
adjusting at least one of the resistance of the resistance element and the second current according the control signal to adjust the output signal corresponding to the second current such that the waveform of the output signal corresponding to the second current matches one of the at least two technical specifications.

* * * * *